(12) United States Patent
Han et al.

(10) Patent No.: US 7,912,693 B1
(45) Date of Patent: Mar. 22, 2011

(54) VERIFYING CONFIGURATION MEMORY OF A PROGRAMMABLE LOGIC DEVICE

(75) Inventors: Ui Sun Han, San Jose, CA (US); Walter N. Sze, Lake Oswego, OR (US); Tsu-Chien Shen, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 460 days.

(21) Appl. No.: 12/113,363

(22) Filed: May 1, 2008

(51) Int. Cl.
*G06F 17/50* (2006.01)
*G06F 9/00* (2006.01)

(52) U.S. Cl. ............... 703/14; 703/21; 703/22; 703/24; 710/22

(58) Field of Classification Search ............... 703/17, 703/21, 14, 22, 24; 716/4; 714/725; 710/22
See application file for complete search history.

(56) References Cited

U.S. PATENT DOCUMENTS

| | | | |
|---|---|---|---|
| 6,389,379 B1 * | 5/2002 | Lin et al. ................. | 703/14 |
| 6,651,225 B1 * | 11/2003 | Lin et al. ................. | 716/4 |
| 6,810,442 B1 * | 10/2004 | Lin et al. ................. | 710/22 |
| 7,512,850 B2 * | 3/2009 | Redgrave et al. ......... | 714/725 |
| 2002/0152060 A1 * | 10/2002 | Tseng ....................... | 703/17 |
| 2003/0144828 A1 * | 7/2003 | Lin ........................... | 703/21 |

* cited by examiner

*Primary Examiner* — Thai Phan
(74) *Attorney, Agent, or Firm* — LeRoy D. Maunu

(57) ABSTRACT

Systems and methods are provided for verifying respective configuration data values for programming configuration memory cells of an integrated circuit device such as a programmable logic device (PLD). Each configuration memory cell controls an input of a corresponding initialization value from a file in response to a selectable assertion of an initialization signal of a test bench during a logic simulation of the PLD. The file structurally associates the configuration memory cell with the corresponding initialization value. A current value of one or more of the configuration memory cells is written with the respective configuration data value via a configuration port of the PLD during the logic simulation. Each configuration memory cell compares its initialization and current values in response to a selectable assertion of a check signal of the test bench. A mismatch error is output in response to a difference between the initialization and current values of one or more of the configuration memory cells.

19 Claims, 4 Drawing Sheets

US 7,912,693 B1

VERIFYING CONFIGURATION MEMORY OF A PROGRAMMABLE LOGIC DEVICE

FIELD OF THE INVENTION

The present invention generally relates to configuration of programmable logic devices, and more particularly to verifying the configuration of programmable logic devices.

BACKGROUND OF THE INVENTION

Programmable logic devices (PLDs) are a well-known type of integrated circuit that can be programmed to perform a specified logic design. One type of PLD, the field programmable gate array (FPGA), typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a logic design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual configuration memory cells then determine the logic design implemented by the FPGA.

Synthesis tools and place and route tools generate the configuration data from a specification of a logic design. The FPGA implements the logic design when the configuration memory cells are programmed by loading the stream of configuration data into the FPGA.

Designers rely on the tools to generate correct configuration data. However, it may be time consuming and expensive for tool makers to verify that the tools correctly generate the configuration data. Verification of the configuration data requires simulation of the loading of the configuration data into the configuration memory cells of the FPGA. A simulation of the loading of configuration data is time consuming because a large number of clock cycles is required for loading the configuration data into the FPGA. Furthermore, once the configuration data is loaded into the FPGA, it may be difficult to determine whether the configuration memory cells have the correct values.

The present invention may address one or more of the above issues.

SUMMARY OF THE INVENTION

Various embodiments of the invention provide a system for verifying respective configuration data values for programming configuration memory cells of a programmable logic device (PLD). A logic simulator simulates a test bench and each configuration memory cell of the PLD. The simulation of the test bench includes a selectable assertion of an initialization signal and a selectable assertion of a check signal. The simulation of each configuration memory cell includes controlling an input of the corresponding initialization value from a file in response to the selectable assertion of the initialization signal. The file structurally associates each configuration memory cell of the PLD with a corresponding initialization value. The simulation of each configuration memory cell also includes writing a current value of the configuration memory cell with the respective configuration data value via a configuration port of the PLD. The simulation of each configuration memory cell further includes outputting a mismatch error to a user interface in response to the selectable assertion of the check signal together with a difference between the corresponding initialization value and the current value of the configuration memory cell.

Various other embodiments of the invention provide a method for verifying respective configuration data values for programming configuration memory cells of a PLD. Each configuration memory cell controls an input of a corresponding initialization value from a file in response to a selectable assertion of an initialization signal of a test bench during a logic simulation of the PLD. The file structurally associates the configuration memory cell with the corresponding initialization value. A current value of one or more of the configuration memory cells is written with the respective configuration data value via a configuration port of the PLD during the logic simulation. Each configuration memory cell compares its initialization value with a current value of the configuration memory cell in response to a selectable assertion of a check signal of the test bench during the logic simulation. A mismatch error is output in response to a difference between the initialization and current values of one or more of the configuration memory cells.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
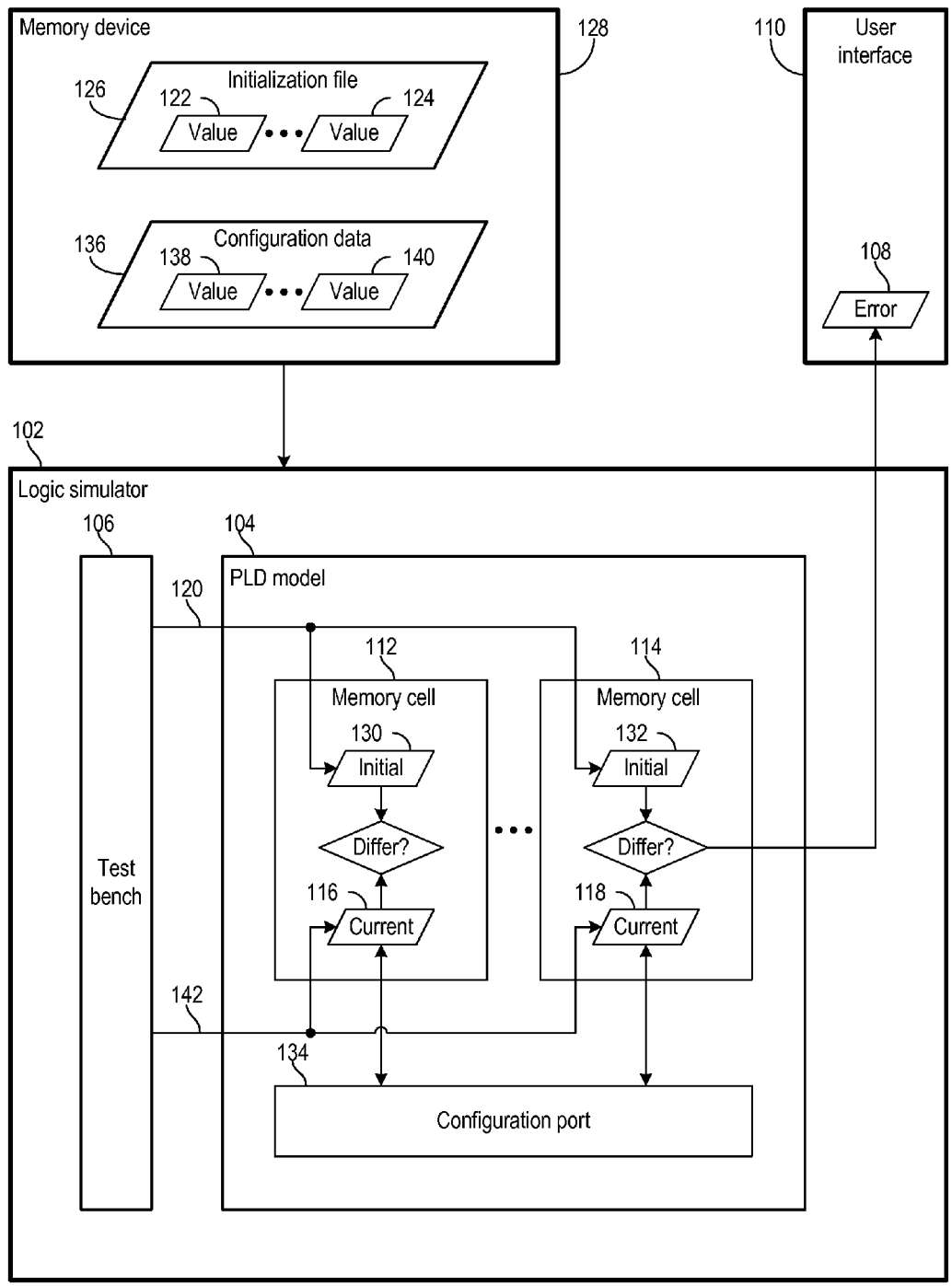
FIG. 1 is a block diagram of a system for verifying values of the configuration memory cells of a programmable logic device in accordance with various embodiments of the invention.

FIG. 1 is a block diagram of a system for verifying values of the configuration memory cells of an integrated circuit such as a programmable logic device (PLD) in accordance with various embodiments of the invention. A logic simulator 102 simulates a model 104 of the PLD and a test bench 106 for testing the PLD model 104. Any error 108 discovered during the simulation is a status signal displayed on a user interface 110. It is noted here that embodiments of the present invention may be employed in the context of many different types of integrated circuits. However, programmable logic devices (PLDs) require configuration memory and are particularly amenable to implementation of various embodiments. For that reason, reference to programmable logic devices (PLDs) is used throughout this description for the purpose of illustration.

The configuration memory cells 112 through 114 model the configuration memory of the PLD. A current value 116 of configuration memory cell 112 determines the function of a programmable logic or interconnect resource associated with the configuration memory cell 112. Similarly, a current value 118 of configuration memory cell 114 determines the function of another programmable logic or interconnect resource. Collectively, the current values 116 through 118 of the configuration memory cells 112 through 114 implement a logic design in the programmable logic and interconnect resources of the PLD.

In one embodiment, test bench 106 asserts an initialization signal on line 120. The assertion of the initialization signal on line 120 causes each configuration memory cell 112 through 114 to find a corresponding one of initialization values 122 through 124 in the initialization file 126 stored in memory device 128. Upon assertion of the initialization signal on line 120, configuration memory cell 112 sets the initial value 130 from the corresponding value 122 in the initialization file 126. Configuration memory cell 114 similarly sets the initialization value 132 from the corresponding value 124 in the initialization file 126. The memory device may be implemented according to implementation requirements using electronic RAM or magnetic or optical disk storage, for example.

Configuration memory cell 112 may have a name within PLD model 104. For example, configuration memory cell 112 has a structural name given by the hierarchy of blocks that include configuration memory cell 112 within PLD model 104. Configuration memory cell 112 responds to the assertion of the initialization signal on line 120 by finding the value 122 in initialization file 126 corresponding to the name of the configuration memory cell 112. For example, each value 122 or 124 in initialization file 126 is a pair of a structural name and an initialization value. The configuration memory cell 112 searches the initialization file 126 for the value 122 including the structural name that matches the structural name of the configuration memory cell 112. The configuration memory cell then inputs the initialization value 130 from this corresponding value 122 in the initialization file. Each configuration memory cell 112 through 114 independently searches for the corresponding one of values 122 through 124 in the initialization file 126.

After the initialization of the initialization values 130 through 132 in the configuration memory cells 112 through 114, the configuration port 134 accesses the current values 116 through 118. For example, the PLD model 104 is configured to implement a logic design by loading configuration data 136 into the PLD model 104. The configuration port 134 distributes and writes the values 138 and 140 from the configuration data 136 to the appropriate current values 116 through 118 of the configuration memory cells 112 through 114.

Upon completion of the access to the current values 116 through 118 of the configuration memory cells 112 through 114, the test bench 106 asserts the check signal on line 142. The assertion of the check signal on line 142 independently causes each configuration memory cell 112 through 114 to compare the corresponding initial and current values. Configuration memory cell 112 compares the initial value 130 with the current value 116 upon assertion of the check signal on line 142. Configuration memory cell 114 similarly compares the initial value 132 and the current value 118. If values 132 and 118 differ, configuration memory cell 114 outputs an error message 108 on user interface 110.

For an access that loads configuration data 136 into the PLD model 104 between an assertion of the initialization signal on line 120 and an assertion of the check signal on line 142, any error message 108 can indicate a problem with the formatting of the configuration data 136.

Figure 2:
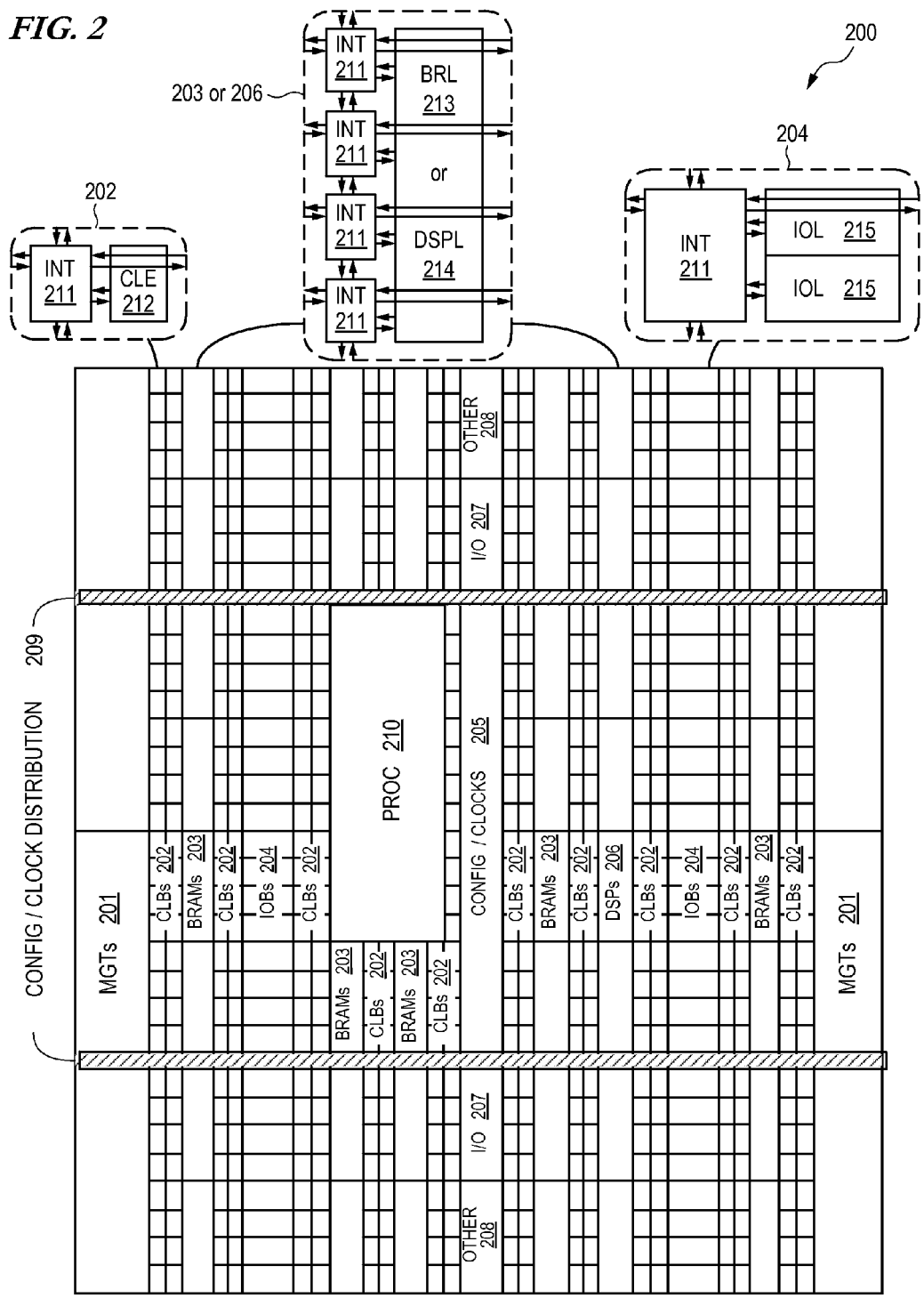
FIG. 2 is a block diagram of a programmable logic device that is verified in accordance with various embodiments of the invention.

FIG. 2 is a block diagram of an example programmable logic device (PLD) that is verified in accordance with various embodiments of the invention. The PLD includes programmable logic and interconnect resources that are configured by the current values of configuration memory cells of the PLD. Various embodiments of the invention permit checking the values of the configuration memory cells of the PLD.

PLDs, such as advanced FPGAs, may include several different types of programmable logic blocks in the array. FIG. 2 illustrates an example FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
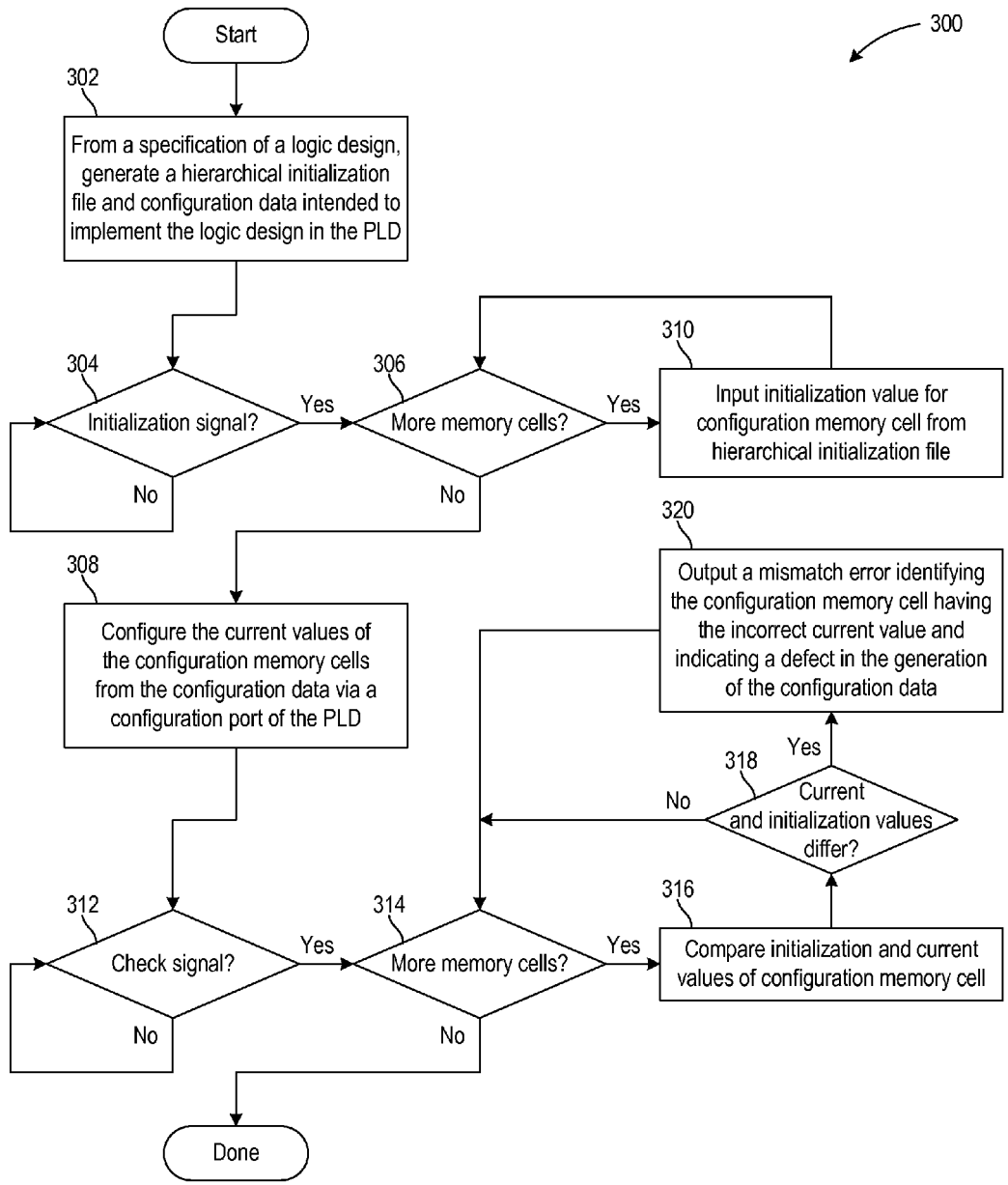
FIG. 3 is a flow diagram of a process for verifying configuration data for a programmable logic device in accordance with various embodiments of the invention.

FIG. 3 is a flow diagram of a process 300 for verifying configuration data for a programmable logic device (PLD) in accordance with various embodiments of the invention. The process verifies that the configuration data correctly implements a logic design in the PLD.

At step 302, an initialization file and configuration data for a PLD are generated from a specification of the logic design. The specification of the logic design may be specified in a hardware description language, such as Verilog or VHDL. Software tools generate the initialization file and the configuration data by synthesizing, mapping, placing, and routing the specification of the logic design.

The software tools first generate the initialization file that structurally specifies an initialization value for each configuration memory cell of the PLD. The programmable logic and interconnect resources of the PLD implement the logic design when the current value of each configuration memory cell is set to the corresponding initialization value from the initialization file. The initialization file includes a hierarchical name and the initialization value for each configuration memory cell.

The software tools generate the configuration data from the initialization file. The configuration data includes the initialization values formatted in a particular order as determined by the design of the PLD. The configuration data might also include additional information such as the length of the configuration data and a checksum or cyclic redundancy code for ensuring the configuration data is not corrupted.

Decision 304 checks whether a test bench has asserted an initialization signal during a logic simulation of the PLD and the test bench. If the initialization signal is asserted, process 300 proceeds to decision 306; otherwise, process 300 remains at decision 304. Decision 306 checks whether every configuration memory cell in the PLD is initialized. If all configuration memory cells are initialized, process 300 proceeds to step 308; otherwise, process 300 proceeds to step 310 to initialize the next configuration memory cell. At step 310, the next configuration memory cell searches the initialization file for an entry matching the structural name of the configuration memory cell, and the configuration memory cell inputs the corresponding initialization value from this entry in the initialization file.

At step 308, the PLD is configured with configuration data during a logic simulation of the PLD. The current values of the configuration memory cells are set from the configuration data via the configuration port of the PLD.

Decision 312 checks whether the test bench has asserted a check signal during the logic simulation. If the check signal is asserted, process 300 proceeds to decision 314; otherwise, process 300 remains at decision 312. Decision 314 determines whether more configuration memory cells need to be checked. If all configuration memory cells are checked, process 300 completes; otherwise, process 300 proceeds to step 316 to check the next configuration memory cell.

At step 316, the initialization and current values are compared for the next configuration memory cell. Decision 318 checks whether the initialization and current values differ. For a difference, process 300 proceeds to step 320; otherwise, process 300 returns to decision 314. At step 320, a mismatch error is output that identifies the configuration memory cell with differing initialization and current values. The mismatch error includes a structural name of the configuration memory cell within the block hierarchy of the PLD. The mismatch error may indicate that the current value of the configuration memory cell was incorrectly set from the configuration data at step 308. This indicates a defect in the generation of the configuration data.

Figure 4:
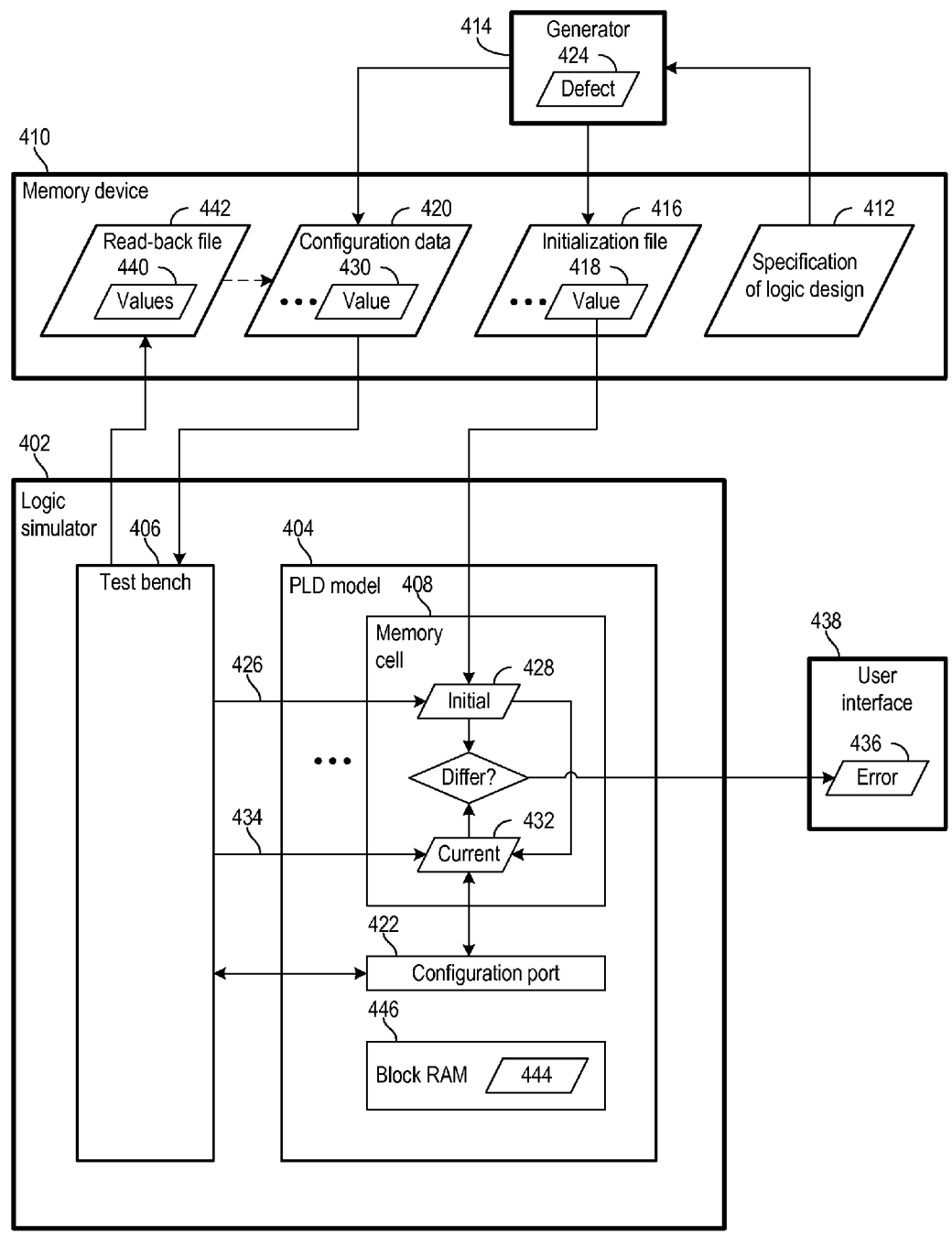
FIG. 4 is a data flow diagram of a process for verifying values of the configuration memory cells of a programmable logic device in accordance with various embodiments of the invention.

FIG. 4 is a data flow diagram of a process for verifying values of the configuration memory cells of a programmable logic device in accordance with various embodiments of the invention. A logic simulator 402 simulates a PLD model 404 and a test bench 406 for verifying a value of the configuration memory cell 408.

A memory device 410 stores a specification 412 of a logic design, and a generator 414 generates an initialization file 416 from the specification 412 of the logic design. The initialization file 416 structurally associates an initialization value 418 with each configuration memory cell 408. The PLD implements the logic design when the current values of the configuration memory cells are equal to the associated initialization values. The generator 414 stores the initialization file 416 in the memory device 410.

The generator 414 also generates configuration data 420 and stores the configuration data 420 in memory device 410. The format of configuration data 420 can be determined late in the design of the PLD model 404 because connecting the configuration port 422 with each configuration memory cell 408 is a final step of the design of the PLD model 404. The connections between the configuration port 422 and each configuration memory cell 408 determines, for example, the ordering of the values for the configuration memory cells in the configuration data 420.

In an example scenario, the generator 414 might have a defect 424 that causes the generator 414 to generate the configuration data 420 incorrectly. For example, the generator 414 might incorrectly order the values for the configuration memory cells in the configuration data 420. A time consuming modification of the generator 414 is required to implement the ordering of values in the configuration data 420, and the completion of the design of the PLD model 404 establishes the ordering of the values in the configuration data 420. Thus, generator 414 might not be able to properly generate configuration data 420 until after the completion of the design of the PLD model 404. Furthermore, testing of the configuration port 422 of the PLD model 404 might not be possible until generator 414 correctly generates configuration data 420. Thus, the delayed availability of configuration data 420 may delay the testing of the configuration port 422 and the detection of any defect 424 in generator 414.

Various embodiments of the invention permit testing of the configuration port 422 and the generator 414 before the generator 414 correctly generates configuration data 420.

The test bench 406 generates an initialization signal on line 426 that causes configuration memory cell 408 to load initialization value 418 from initialization file 416 into the initialization value 428 of configuration memory cell 408. The test bench 406 loads configuration data 420 into PLD model 404 via configuration port 422, including loading value 430 into the current value 432 of the configuration memory cell 408. The test bench 406 generates a check signal on line 434 that causes configuration memory cell 408 to compare the current value 432 with the initialization value 428. If the current value 432 differs from the initialization value 428, the configuration memory cell 408 outputs an error message 436 on user interface 438. The error message 436 indicates that the configuration port 422 is defective or that the generator 414 has a defect 424.

Certain embodiments of the invention permit testing of the configuration port 422 of PLD model 404 before configuration data 420 becomes available. In one embodiment, the assertion of the initialization signal on line 426 causes each configuration memory cell 408 to load the initialization value 418 from initialization file 416 into both the initialization value 428 and the current value 432. The test bench 406 provides a read-back command to configuration port 422 and configuration port 422 responds by outputting the current value 432 from each configuration memory cell 408. The test bench 406 stores the read-back values 440 in read-back file 442 of memory device 410. Because the ordering of the values 440 in the read-back file 442 is generated by the configuration port 422, the read-back file 442 contains the initialization value 418 for each configuration memory cell 408 ordered in a format that parallels the ordering needed for each value 430 in the configuration data 420. Thus, the read-back file 442 is useful for generating configuration data 420 even though generator 414 is not yet ready to generate the configuration data 420.

The configuration port 422 might support a variation of read-back that captures the current value 432 of at least one configuration memory cell 408 internally in values 444 in block RAM 446 of PLD model 404. The configuration port 442 might also support restoring the current value 432 of the configuration memory cell 408 from values 444 of block RAM 446.

The test bench 406 tests internal capture and restore by asserting the initialization signal on line 426 to cause the configuration memory cell 408 to initialize the initialization value 428 and the current value 432. Then, the test bench 406 commands the configuration port 422 to capture the current value 432 of the configuration memory cell 408 in the values 444 of the block RAM 446. The test bench 406 commands the configuration port 422 to restore the current value 432 of configuration memory cell 408 from values 444 of the block RAM 446. The test bench 406 then asserts the check signal on line 434 to cause the configuration memory cell 408 to compare the updated current value 432 with the initialization value 428. If the capture and restore operation corrupts the current value 432 of the configuration memory cell 408, the configuration memory cell 408 outputs an error message 436 on user interface 438.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for verifying values of configuration memory cells of a programmable logic device. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A system for verifying respective configuration data values for programming a plurality of configuration memory cells of an integrated circuit device, comprising:
    a memory device adapted to store a file that structurally associates each configuration memory cell of the integrated circuit device with a corresponding initialization value; and
    a logic simulator adapted to simulate a test bench including a selectable assertion of an initialization signal and a selectable assertion of a check signal, the logic simulator further adapted to simulate each configuration memory cell of the integrated circuit device using a model of the configuration memory cells, the model of the configuration memory cells including storage for an initial value and a current value for each configuration memory cell, and the simulation including:
        controlling an input of the corresponding initialization value from the file to the storage for the initial value in the model of the configuration memory cell in response to the selectable assertion of the initialization signal,
        writing the respective configuration data value to the storage for the current value in the model of the configuration memory cell via simulation of a configuration port of the integrated circuit device, and
        outputting a mismatch error to a user interface in response to the selectable assertion of the check signal together with a difference between the initial value in the model of the configuration memory cell and the current value in the model of the configuration memory cell.

2. The system of claim 1 wherein the integrated circuit device is a programmable logic device (PLD).

3. The system of claim 1, wherein the simulation of the configuration port writes to the storage for the current values in the model of the configuration memory cells with the respective configuration data values from configuration data for implementing a logic design in the integrated circuit device.

4. The system of claim 3, wherein the mismatch error structurally identifies the configuration memory cell.

5. The system of claim 1, wherein the logic simulator is further adapted to simulate each configuration memory cell of the integrated circuit device including setting the storage for the current value in the model of the configuration memory cell to the corresponding initialization value in response to the selectable assertion of the initialization signal.

6. The system of claim 1, wherein the simulation of the configuration port performs a read-back operation of the model of the configuration memory cells in response to a read-back command, and the logic simulator is further adapted to simulate the test bench that generates the read-back command and outputs a file to the memory device that includes the initialization values of the configuration memory cells from the read-back operation.

7. The system of claim 1, wherein the simulation of the configuration port performs a read-back operation of the model of configuration memory cells in response to a read-back command, and the logic simulator is further adapted to simulate the test bench that generates the read-back command and outputs a file to the memory device that includes the current values of the configuration memory cells from the read-back operation.

8. The system of claim 1, further comprising the user interface adapted to display the mismatch error from the configuration memory cell of the logic simulator in response to the selectable assertion of the check signal together with the difference between the corresponding initialization value and the current value of the configuration memory cell.

9. A method for verifying respective configuration data values for programming a plurality of configuration memory cells of an integrated circuit IC, comprising:
   in response to a selectable assertion of an initialization signal of a test bench for testing the integrated circuit during a logic simulation of the integrated circuit using a model of the configuration memory cells, controlling input of corresponding initialization values from a file which structurally associates the configuration memory cells with the corresponding initialization values, to storage for the corresponding initial values in the model of the configuration memory cells;
   writing to storage in the model for current values of the configuration memory cells, the respective configuration data values via simulation of a configuration port of the integrated circuit during the logic simulation; and
   in response to a selectable assertion of a check signal of the test bench during the logic simulation, comparing the initialization values for the configuration memory cells with corresponding ones of the current values of the configuration memory cells, wherein the comparing of the initialization and current values in the model of the configuration memory cells includes outputting a mismatch error in response to a difference between at least one of the initialization and current values.

10. The method of claim 9, wherein the writing includes writing data for implementing a logic design in the integrated circuit.

11. The method of claim 10, wherein the mismatch error structurally identifies each configuration memory cell having the respective configuration data value that is incorrect because the respective configuration data value differs from the initialization value.

12. The method of claim 11, further comprising generating the configuration data from a specification of the logic design, wherein the mismatch error indicates at least one defect in a software tool that performs the generating of the configuration data from the specification of the logic design.

13. The method of claim 9, wherein the controlling the input of the corresponding initialization values includes setting storage for the current values in the model of the configuration memory cells to the corresponding initialization values in response to the selectable assertion of the initialization signal during the logic simulation.

14. The method of claim 9, further comprising outputting a file to the memory device via the configuration port of the integrated circuit in response to the test bench commanding the integrated circuit to read back the initialization values from the model of the configuration memory cells during the logic simulation.

15. The method of claim 9, further comprising outputting a file to the memory device via the configuration port of the integrated circuit in response to the test bench commanding the integrated circuit to read back the current values from the model of the configuration memory cells during the logic simulation.

16. The method of claim 9, wherein the writing during the logic simulation includes internally reading the current values from the model of the configuration memory cells via the configuration port of the integrated circuit, storing the current values in a model of a memory of the integrated circuit, and internally writing to the current values in the model of the configuration memory cells with the current values from the model of the memory via the simulation of the configuration port.

17. The method of claim 9, further comprising simulating an implementation of a logic design in the integrated circuit during the logic simulation following the input of the corresponding initialization values of the configuration memory cells from the file in response to the selectable assertion of the initialization signal.

18. The method of claim 9, wherein the integrated circuit includes an array of configurable logic and interconnect resources that are configured to implement a logic design in response to the current values of the configuration memory cells.

19. A system for verifying respective configuration data values for programming a plurality of configuration memory cells of a programmable integrated circuit (IC), comprising:
   means for asserting an initialization signal and a check signal during a logic simulation of the programmable IC;
   means for controlling input to storage for initialization values in a model of the for configuration memory cells in response to the initialization signal becoming asserted;
   means for writing respective configuration data values to storage in the model for current values of the configuration memory cells;
   means for comparing the initialization values in the model of the configuration memory cells with the current values in the model of the configuration memory cells in response to the check signal becoming asserted; and
   means, responsive to the means for comparing, for outputting a status signal based on comparison of the initialization values and current values.

* * * * *